(12) United States Patent
Nakamura

(10) Patent No.: US 6,674,008 B2
(45) Date of Patent: *Jan. 6, 2004

(54) CROSS SUBSTRATE, METHOD OF MOUNTING SEMICONDUCTOR ELEMENT, AND SEMICONDUCTOR DEVICE

(75) Inventor: Akio Nakamura, Tokyo (JP)

(73) Assignee: Oki Electric Industry Co., Ltd., Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/544,172

(22) Filed: Apr. 6, 2000

(65) Prior Publication Data
US 2002/0104671 A1 Aug. 8, 2002

(30) Foreign Application Priority Data
Dec. 16, 1999 (JP) .............................. 11-357491

(51) Int. Cl.[7] .............................. H02G 3/04; H02G 3/00
(52) U.S. Cl. .................................. 174/98; 174/117 M
(58) Field of Search .............................. 174/52.2, 52.4, 174/98, 117 M; 257/776, 787, 788

(56) References Cited

U.S. PATENT DOCUMENTS

| 5,403,671 A | * | 4/1995 | Holzmann | 428/601 |
| 5,491,303 A | * | 2/1996 | Weiss | 174/262 |
| 5,847,929 A | * | 12/1998 | Bernier et al. | 361/719 |
| 6,300,679 B1 | * | 10/2001 | Mukerji et al. | 257/738 |

FOREIGN PATENT DOCUMENTS

| JP | 5074975 | | 3/1993 |
| JP | 5-299533 | | 11/1993 |
| JP | 6-139823 | | 5/1994 |
| JP | 406176624 | * | 6/1994 |
| JP | 7-65629 | | 3/1995 |
| WO | WO 97/00598 | | 1/1997 |

* cited by examiner

Primary Examiner—Hung V. Ngo
(74) Attorney, Agent, or Firm—Volentine Francos, PLLC

(57) ABSTRACT

A cross substrate and a method of mounting a semiconductor element are provided in which semiconductor elements can be mounted at a high density. Element side electrodes of a circuit forming surface of a semiconductor element and conductive filaments of a cross substrate are connected in a one-to-one correspondence by solder bumps. Thereafter, sealing is carried out by using a molten epoxy-based resin. In this way, a circuit forming surface side of the semiconductor element is sealed with sealing resin of the cross substrate, with the element side electrodes of the mounted semiconductor element electrically connected to conductive filaments which are wires of a cross substrate.

9 Claims, 10 Drawing Sheets

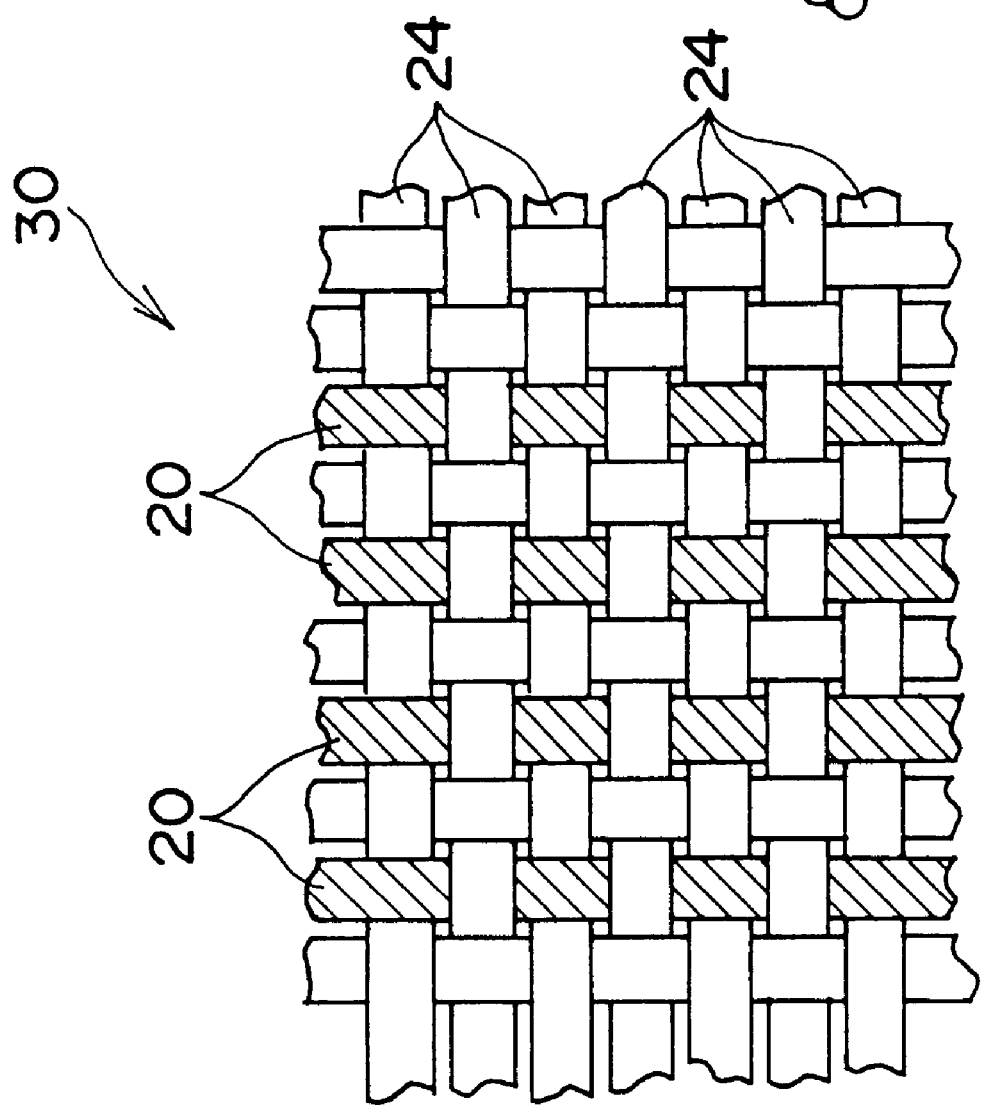
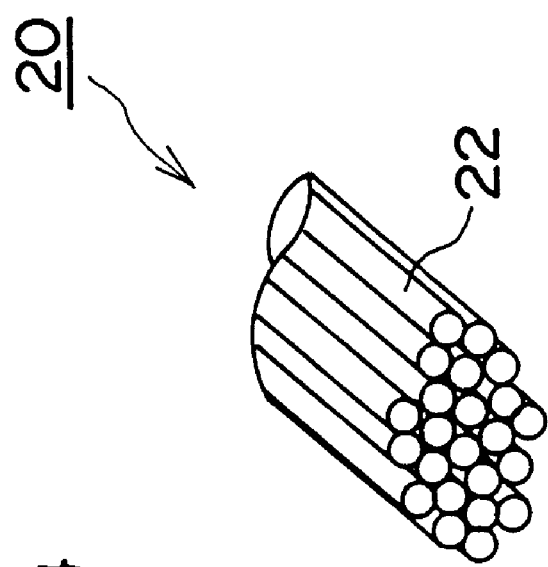

CROSS SUBSTRATE, METHOD OF MOUNTING SEMICONDUCTOR ELEMENT, AND SEMICONDUCTOR DEVICE

BACKGROUND OF THE INVENTION

1. Field of the Invention

The present invention relates to a cross substrate, a method of mounting a semiconductor element, and a semiconductor device, and in particular to a cross substrate which is a mount substrate to which a semiconductor substrate is mounted, and to a method of mounting a semiconductor element to the cross substrate.

2. Description of the Related Art

In a conventional method of manufacturing a semiconductor device in which a semiconductor element is mounted on a mount substrate, as illustrated in FIG. 10, a semiconductor element 82 is disposed on a wiring forming surface 80a of a mount substrate 80 such that a circuit forming surface 82a of the semiconductor element 82 is the upper surface. After the semiconductor element 82 is fixed by an adhesive to the mount substrate 80, a substrate side electrode 84 and an element side electrode 86 are bonded by a metal wire 88 such as a gold wire, and the structure is sealed and packaged by a sealing resin 81 which is insulative.

As illustrated in FIG. 10, the semiconductor device obtained by this method becomes excessively thick by an amount corresponding to the loop height H of the wire 88 and the thickness L of the sealing resin 81 covering the wire 88. In order to overcome this problem, various mounting methods have been proposed.

"In one such method, as illustrated in FIG. 11, with the circuit forming surface 82a of the semiconductor element 82 and the wiring forming surface 80a of the mount substrate 80 opposing one another, the substrate side electrodes of the mount substrate 80 and the element side electrodes of the semiconductor element 82 are joined together by solder bumps 85. The space between the circuit forming surface 82a of the semiconductor element 82 and the wiring forming surface 80a of the mount substrate 80 is sealed by the sealing resin 81 which is insulative. As shown in FIG. 11, because no wire is used in a semiconductor device obtained by this method, a semiconductor device having a thinner package can be obtained."

In recent years, the demand to shrink products equipped with semiconductor devices has increased even more. However, there are limits to shrinking the dimensions of semiconductor devices. Further, because there are limits to shrinking the mounted volume of semiconductor devices, conventional methods cannot completely satisfy this demand.

Namely, in the case of the structure of the conventional semiconductor device illustrated in FIG. 10 and described above, if the entire length of the wire is increased to a certain extent, there are problems such as the wire may contact the corner portion of the semiconductor element and form a short circuit, or the wire may break resulting in a defective connection, or in the worst case, the wire may be disconnected. Because the length of the wire must be extended to a certain extent, the resin sealing the wire becomes thicker than the wiring substrate, and the semiconductor device package becomes that much thicker. Thus, there are limits to shrinking the overall dimensions of the semiconductor device. Further, load may be applied to the wire during the sealing by the sealing resin, or the wire may contact an adjacent wire and form a short circuit, and there is thus the concern that the wire may be broken.

In the case of the structure illustrated in FIG. 11, because no wires are used, the problems associated with wires can be avoided, and the semiconductor device on the whole can be made thinner than the semiconductor device illustrated in FIG. 10. However, because the solder bumps are provided between the mount substrate and the semiconductor element, the semiconductor device becomes excessively thick by an amount corresponding to the height of the solder bumps.

SUMMARY OF THE INVENTION

In view of the aforementioned, an object of the present invention is to provide a cross substrate on which semiconductor elements can be mounted at a high density, a method of mounting a semiconductor element, and a semiconductor device.

The first aspect of the present invention is a cross substrate including at least one resin sealed layer of a cross member, the at least one resin sealed layer of a cross member having warp threads and weft threads, wherein a portion of at least one of the warp threads and weft threads include a plurality of conductive thread-like wire members disposed substantially parallel to one another, with the wire members electrically insulated from one another, and an electrode portion formed at one region of the thread-like wire members.

In the first aspect of the present invention, the cross member forms a wiring portion of the cross substrate at which a semiconductor element is mounted. In order to electrically connect the semiconductor element and the wires, the electrode portions of the semiconductor element are electrically connected to at least one portion of the thread-like wire members which are the wires. Thus, the position at which the semiconductor element is mounted is not limited by the positions at which the electrode portions of the cross member are formed, and the semiconductor element can be mounted relatively freely. Accordingly, semiconductor elements can be mounted at a high density, and the obtained product has a more compact structure than conventional products.

If the thread-like wire members are used, there is no need to provide the electrodes of the semiconductor element at the periphery as in the case of conventional wire bonding. The positions of the electrodes provided at the semiconductor element can be determined freely. Therefore, the number of degrees of freedom in the arranging and designing of the circuit formed on the semiconductor element increases, and the region for the circuit of the semiconductor element can be utilized effectively. Therefore, the semiconductor element is more compact than conventional semiconductor elements, and as a result, the product can be made more compact.

The cross substrate is used not only for the mounting of a semiconductor element to a structure in which a cross member is sealed by sealing resin in advance, but also can be used when the semiconductor element is sealed and mounted at the time the cross members is sealed by sealing resin, as will be explained later.

Namely, the tenth aspect of the present invention is one method of mounting a semiconductor element in which a semiconductor element is mounted to the cross substrate of the first aspect. This method includes the steps of: (a) providing a cross member having at least one layer of warp threads and weft threads, wherein a portion of at least one of the warp threads and weft threads include a plurality of conductive thread-like wire members disposed substantially parallel to one another, with the wire members electrically insulated from one another, and an electrode portion formed at one region of the thread-like wire members; (b) mounting a semiconductor element having an electrode forming surface with a plurality of electrodes thereat, onto the at least one layer of the cross member such that at least one of the plurality of electrodes of the semiconductor element is electrically connected to at least one of the thread-like wires; and (c) sealing the cross member and the electrode forming surface of the semiconductor element with an insulating resin.

As in a second aspect and an eleventh aspect of the present invention, it is preferable that the thread-like wire members have surfaces covered by an insulating material, other than at the electrode portion. In this way, the occurrence of short circuits and the like can be suppressed.

As in a third aspect and a twelfth aspect of the present invention, thread-like wire members can be provided in plural directions by the following structure: the cross substrate further comprises at least one other layer of a cross member, the at least one other cross member having warp threads and weft threads, wherein a portion of at least one of the warp threads and weft threads include a plurality of conductive thread-like wire members disposed substantially parallel to one another, the thread-like wire members of each cross-member being oriented in a direction different from the thread-like wire members in the other cross-member. Therefore, limitations on the positions for mounting the semiconductor element due to the positions at which the electrode portions of the cross members are formed are eliminated, and semiconductor elements can be mounted at an even higher density.

In a fourth aspect and a thirteenth aspect of the present invention, thread-like wire members are used whose surfaces are covered with an insulative material, other than at positions at which the electrodes of the semiconductor element are provided. A portion of both of the warp threads and the weft threads include a plurality of conductive thread-like wire members disposed substantially parallel to one another, with the wire members electrically insulated from one another, and at an intersecting position, at least one wire member of the warp threads crosses at least one wire member of the weft threads, and are electrically connected to one another at the intersecting position.

Namely, portions, other than the electrode positions, of the conductive thread-like wire members are covered by an insulative material. Therefore, the warp threads and the weft threads are formed by conductive thread-like wire members. Even if these thread-like wire members are used as the wires for the cross substrate, the warp thread wires and the weft thread wires do not contact one another and form a short circuit. Further, in the fourth aspect and thirteenth aspect, one of the plurality of conductive thread-like wire members which are provided as the warp threads and one of the plurality of conductive thread-like wire members which are provided as the weft threads are electrically connected at a intersecting position. Thus, the wires can extend in two different directions.

A fifth aspect of the present invention is a cross substrate including: (a) a plurality of conductive members extending in a predetermined first direction; and (b) a plurality of insulating members extending in a second direction intersecting the first direction, and disposed so as to traverse regions between adjacent conductive members.

A ninth aspect of the present invention is a semiconductor device in which a semiconductor element is mounted to the cross substrate of the fifth aspect. Namely, the semiconductor substrate of the ninth aspect includes a semiconductor element having a surface with a plurality of electrodes thereat; a plurality of conductive members which extend in a predetermined first direction with each conductive member electrically connected to a corresponding electrode of the semiconductor element; a plurality of insulative members which extend in a second direction transverse to the first direction, and which are disposed so as to traverse regions between adjacent conductive members; and a sealing resin, the conductive members having surfaces and the conductive members and the electrodes having connected portions, the sealing resin sealing at least the surfaces and connected portions, and leaving at least one portion of the plurality of conductive members exposed.

Namely, the cross substrate of the fifth aspect is formed from a plurality of conductive members and a plurality of insulative members which intersect one another. The cross substrate is well-suited for a case in which the semiconductor element is sealed together with the cross substrate by sealing resin after having been mounted to the cross substrate. Because there is no need to resin-seal the cross substrate itself at the time of manufacturing the cross substrate, the processes for manufacturing the semiconductor device are simplified. Further, in the semiconductor device of the ninth aspect, after the semiconductor element is mounted to the cross substrate of the fifth aspect, the semiconductor element is sealed together with the cross substrate by resin.

In a sixth and a fourteenth aspect of the present invention, the cross substrate forms a casing having an interior with an inner side surface, and a semiconductor element is provided at an inner side surface of an interior of the casing.

Namely, the cross substrate itself, which is a mount substrate and whose core material is the flexible cross member, is sealed by resin. Therefore, the configuration of the cross substrate can be set freely.

For example, sealing by resin is carried out in a state in which the cross member is placed in the casing of an electric product such as a cellular phone or a personal computer or the like. In this way, a cross substrate having the same configuration as the casing can be obtained, and therefore, a casing can be obtained which serves as both a casing and as a cross substrate on which a semiconductor element is mounted. Of course, because the flexible cross member is used as the core material, the cross substrate is relatively flexible even after the resin sealing is carried out. Therefore, the cross substrate can be deformed to a desired configuration by application of an external force such as a bending force.

Namely, the cross substrate, which is a mount substrate at which a semiconductor element is mounted, forms the casing. Therefore, there is no need to provide a mount substrate within the casing in order to mount the semiconductor element. Accordingly, the semiconductor device can be made more compact by an amount corresponding to the lack of a mount substrate within the casing.

Moreover, a seventh aspect of the present invention is a semiconductor device including: (a) a cross substrate comprising at least one resin sealed layer of a cross member, the at least one resin sealed layer of a cross member having warp threads and weft threads, wherein a portion of at least one of the warp threads and weft threads include a plurality of conductive thread-like wire members disposed substantially parallel to one another, with the wire members electrically insulated from one another, and an electrode portion formed at one region of the thread-like wire members; (b) a heat-dissipating plate having a high heat transfer coefficient; and (c) a semiconductor element having a reverse surface side and a circuit forming surface side, the circuit forming surface side being mounted to the cross substrate, and the heat-dissipating plate being sealed at the reverse side surface. Even if heat is generated at the time the semiconductor device is operated, the heat can effectively be released to the exterior. Therefore, a semiconductor device can be obtained in which there is no fear of malfunctioning due to heat.

An eighth aspect of the present invention is a semiconductor device including: (a) a cross substrate comprising at least one resin sealed layer of a cross member, the at least one resin sealed layer of a cross member having warp threads and weft threads, wherein a portion of at least one of the warp threads and weft threads include a plurality of conductive thread-like wire members disposed substantially parallel to one another, with the wire members electrically insulated from one another, and an electrode portion formed at one region of the thread-like wire members; and (b) a semiconductor element having a reverse surface side and a circuit forming surface side, the circuit forming surface side being fixed to the cross substrate, and a conductive layer being disposed in a layer covering the reverse surface side. Mutual effects between semiconductor elements at the time the semiconductor device is switching-operated can be suppressed so that malfunctioning can be prevented. Thus, a semiconductor device which operates stably can be obtained.

BRIEF DESCRIPTION OF THE DRAWINGS

FIG. 3A is a partial top view illustrating an example of a cross base material of the first embodiment.

FIG. 3B is a partial perspective view for explaining the structure of a conductive filament used as a warp thread of the cross base material.

DESCRIPTION OF THE PREFERRED EMBODIMENTS

First Embodiment

Figure 1A:
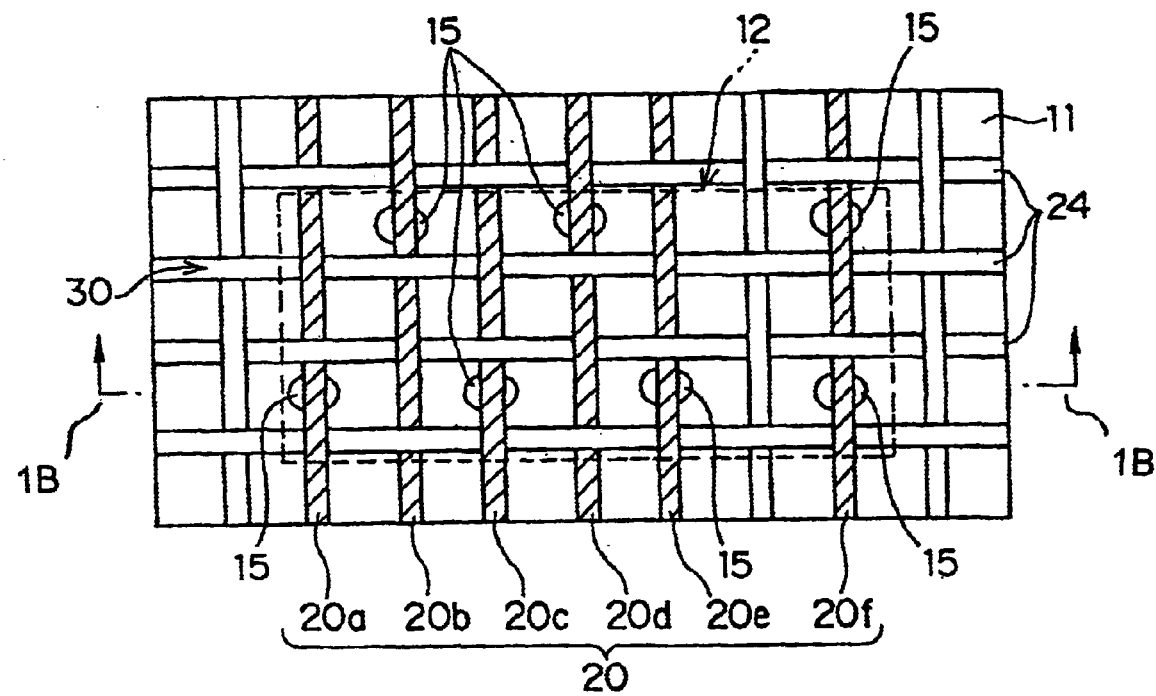
FIG. 1A is a transparent plan view, as seen from a lower surface side, of a cross substrate of a first embodiment of the present invention, to which a semiconductor element is mounted.
Figure 1B:
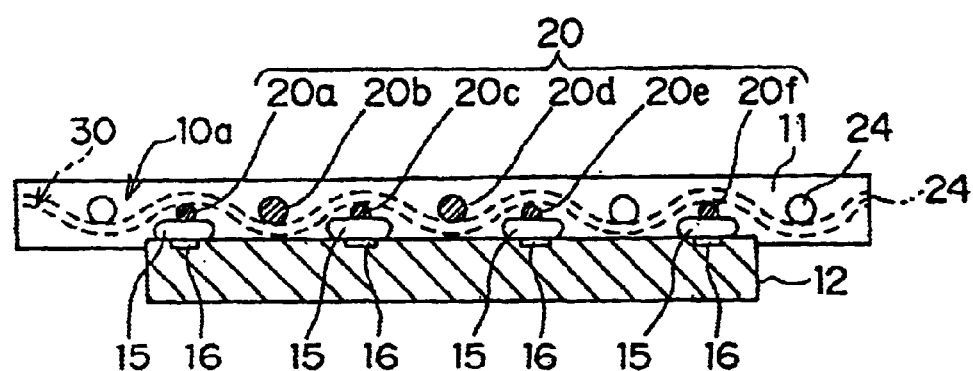
FIG. 1B is a sectional view taken along line X—X of FIG. 1A.

Hereinafter, a first embodiment of the present invention will be described with reference to FIGS. 1A through 3B. As illustrated in FIGS. 1A and 1B, a semiconductor device of the present first embodiment is structured such that, in a state in which conductive filaments 20a through 20f forming a cross base material 30 are electrically connected in a one-to-one correspondence with element side electrodes 16 of a semiconductor element 12, the cross base material 30 and the circuit forming surface of the semiconductor element 12 are sealed by a sealing resin 11.

"This semiconductor device can be formed in the following manner. First, conductive filaments 20 (see FIG. 3B), each of which is formed by bundling conductive carbon fibers 22, and insulative filaments 24, each of which is formed by bundling fibers formed from an insulative material such as glass, are used as the warp threads. The conductive filaments 20 are also used as the weft threads. These filaments 20, 24 are woven into a plain weave so as to form the cross base material 30 illustrated in FIG. 3A. The cross base material 30 is a structural element of a cross substrate 10a which will be described later. The conductive filaments 20 woven into the cross base material 30 serve as wires."

Figure 2A:
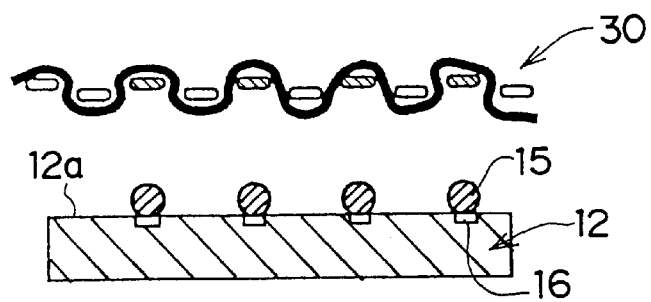
FIGS. 2A through 2D are process diagrams for explaining a method of mounting a semiconductor element of the first embodiment of the present invention.
Figure 2B:
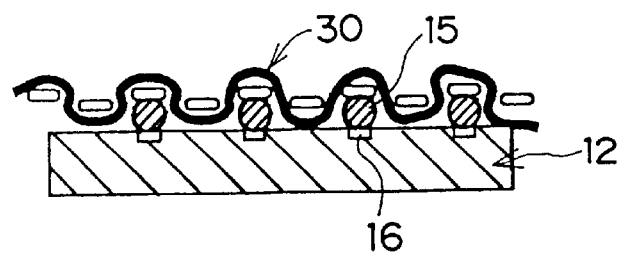

The method of mounting a semiconductor element of the present first embodiment will be described hereinafter with reference to FIGS. 2A through 2D. First, as illustrated in FIG. 2A, the semiconductor element 12 is placed such that a circuit forming surface 12a thereof is the top surface. Solder bumps 15 are placed on the element side electrodes 16 at the circuit forming surface 12a side of the semiconductor element 12. Next, as shown in FIG. 2B, the cross base material 30 structured as described above is disposed on the semiconductor element 12 such that the conductive filaments 20 of the cross base material 30 are disposed in a one-to one correspondence with the solder bumps 15.

Thereafter, the semiconductor element 12 and the cross base material 30 disposed thereon are heated to a predetermined temperature at which the solder melts. Note that when the cross base material 30 is placed on the semiconductor element 12 such that the conductive filaments 20 and the solder bumps 15 contact one another in a one-to-one correspondence, if heating is carried out with pressure being applied such that the cross base material 30 does not move, the conductive filaments 20 and the solder bumps can be electrically connected more precisely, which is preferable.

Figure 2C:
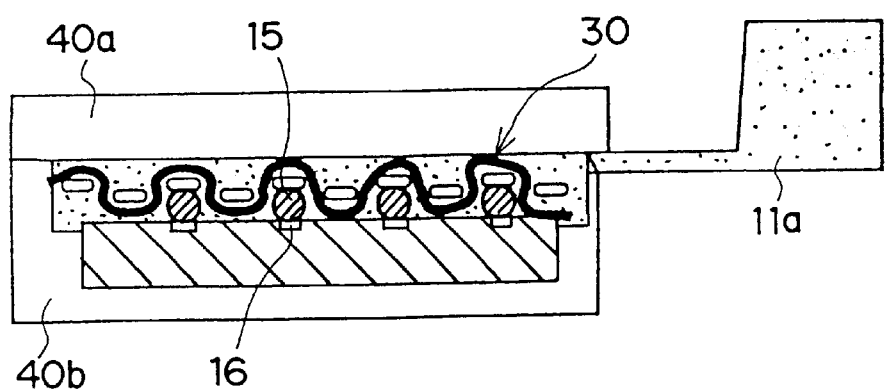
Figure 2D:
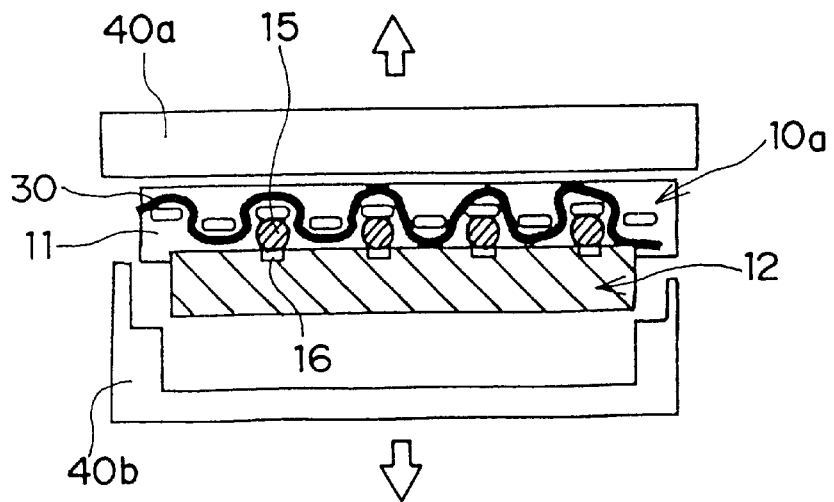

Thereafter as illustrated in FIG. 2C, after being cooled sufficiently, the semiconductor element 12 and the cross base material 30 thereon are placed within a bottom mold 40b with the circuit forming surface 12a of the semiconductor element 12 facing upward. A top mold 40a is set on the bottom mold 40b, and the molds 40a, 40b are fastened together. A molten epoxy-based resin serving as a sealing resin is injected into the cavity which is formed by the upper mold 40a and the lower mold 40b. Note that by reducing the pressure in the cavity at this time, the resin can be filled in the cavity efficiently.

Thereafter, the upper mold 40a and the lower mold 40b are separated, and the semiconductor element 12 and the cross substrate 10a are removed. The obtained cross substrate 10a is a structure in which the sealing resin hardens with the circuit forming surface 12a side of the semiconductor element 12 within the sealing resin. In other words, the semiconductor element 12 is mounted integrally to the cross substrate 10a.

Namely, as illustrated in FIG. 1B, the solder bumps 15, which electrically connect the element side electrodes 16 of the semiconductor element 12 and the conductive filaments 20 which are the wires of the cross substrate 10a, are sealed in the sealing resin 11 together with the cross base material 30 when the sealing resin seals the cross base material 30. At the same time, the circuit forming surface 12a of the semiconductor element 12 is also sealed in the sealing resin 11.

"As a result, the dimensions of the obtained semiconductor device are substantially the same as the dimensions of the semiconductor element 12. The thickness of the semiconductor device varies in accordance with the amount of the semiconductor element 12 within the sealing resin 11. (Namely, if the amount of the semiconductor element 12 within the sealing resin 11 is small, the thickness of the semiconductor device is substantially the same as the total of the thickness of the semiconductor element 12 and the thickness of the cross substrate 10a. If the amount of the semiconductor element 12 within the sealing resin 11 is great, the thickness of the semiconductor device is smaller than the total of the thickness of the semiconductor element 12 and the thickness of the cross substrate 10a.) At the most, the thickness of the semiconductor device is the same as the total of the thickness of the semiconductor element 12 and the thickness of the cross substrate 10a. Thus, a semiconductor device which is much thinner than conventional semiconductor devices can be obtained."

The fixing of the semiconductor element 12 to the cross substrate 10a is carried out simultaneously with the hardening of the sealing resin forming the cross substrate 10a. Thus, there is no need to provide a special process for fixing the semiconductor element 12 to the cross substrate 10a by an adhesive or the like, as there is in the conventional art. Accordingly, the time required to manufacture the semiconductor device can be shortened, the manufacturing efficiency can be improved, and the manufacturing cost can be decreased.

Unlike the case in which the semiconductor element and the mount substrate are connected by a wire, the positions at which the element side electrodes are formed are not limited to the periphery of the circuit forming surface of the semiconductor element. The element side electrodes can be provided at regions which are expedient for the circuit formed on the circuit forming surface. As a result, the number of electrode which can be formed can be increased, and a circuit can be formed at a high-density on the semiconductor element. Thus, the dimensions of the semiconductor element itself can be decreased.

In the present first embodiment, the plural conductive filaments 20 woven into the cross base material 30 as the warp threads are used as the wires. However, the different filaments can function as different wires in accordance with the intended object. For example, in the present first embodiment, among the conductive filaments 20a through 20f illustrated in FIG. 1A, the first conductive filament 20a is a power source wire, the second conductive filament 20b through the fifth conductive filament 20e are signal wires, and the sixth filament 20f is a ground wire.

Further, the material of the conductive filaments 20 is not limited to conductive carbon. Materials which can be used for wires, such as copper, gold, aluminum, various alloys, and the like, can be used for the conductive filaments 20.

Second Embodiment

Figure 4:
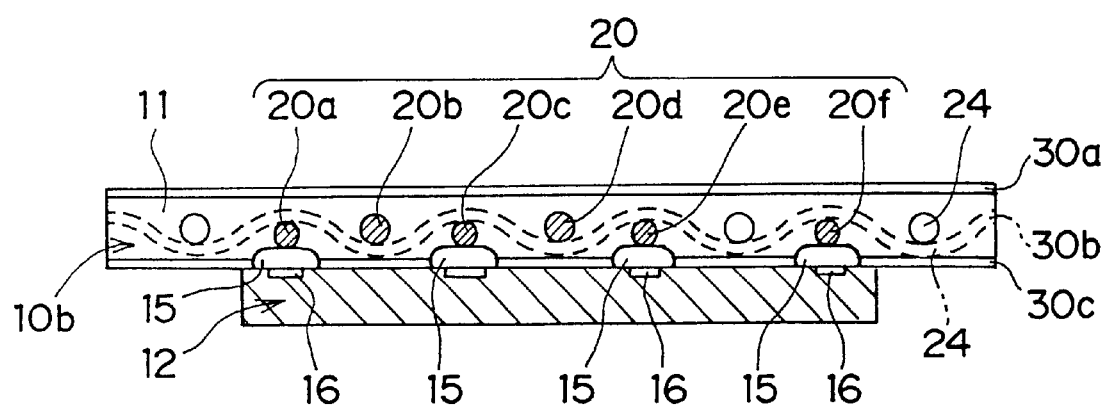
FIG. 4 is a sectional view schematically illustrating a cross substrate of a second embodiment of the present invention, to which a semiconductor element is mounted.

A second embodiment of the present invention will be described hereinafter with reference to FIG. 4. The present second embodiment is an applied example of the above-described first embodiment. As shown in FIG. 4, in the semiconductor device of the present second embodiment, a cross substrate 10b is formed by first through third cross base materials 30a through 30c, which are disposed as three layers, and the sealing resin 11. Of the three layers of the cross base materials 30a through 30c, the middle second cross base material 30b is a wiring layer in which the conductive filaments 20 are used as a portion of the warp threads (as in the first embodiment), and these conductive filaments 20 serve as wires.

Of the three layers of cross base materials 30a through 30c, the first cross base material 30a which is the top layer and the third cross base material 30c which is the bottom layer are formed from the insulative filaments 24 which are formed by fibers made of an insulative material such as glass being bundled together. Both the first cross base material 30a and the third cross base material 30c are thinner than the second cross base material 30b.

In the present second embodiment, as an example, the thickness of the first and the third cross base materials 30a, 30c are each 30% of the thickness of the second cross base material 30b. Further, the mesh of the third cross base material 30c is formed coarsely, such that the spaces between the warp threads and the weft threads are larger than the spaces at the first and second cross base materials 30a, 30b. The molten solder bumps enter in from these spaces so as to be able to contact the wires of the intermediate second cross base material 30b. The other structures are the same as those of the previously-described first embodiment, and therefore, description thereof will be omitted.

In the present second embodiment, the first cross base material 30a and the third cross base material 30c, which are insulative, are provided at the top layer surface side and the bottom layer surface side of the second cross base material 30b which serves as the wiring. Therefore, the second cross base material 30b is not sealed in a state in which the surface of the second cross base material 30b is exposed to the resin.

Accordingly, in addition to the effects of the above-described first embodiment, short circuits occurring between wires whose surfaces are exposed can be prevented, and therefore, a more electrically stable cross substrate can be obtained. Further, because the cross base materials which form the skeleton of the cross substrate are provided in plural layers, the flexural strength of the cross substrate improves.

In the present second embodiment, the cross substrate 10b is structured by the insulative first cross base material 30a and the insulative third cross base material 30c being provided at the top surface side and the bottom surface side of the second cross base material 30b which serves as the wiring. However, the second embodiment is not limited to this structure. For example, two or more layers of insulative cross base materials may be provided at at least one of the top surface side or the bottom surface side of the second cross base material 30b. Alternatively, at least one layer of an insulative cross base material may be provided at only the top surface side or at only the bottom surface side of the second cross base material which serves as the wiring.

Third Embodiment

Figure 5A:
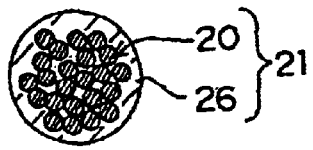
FIG. 5A is a sectional view of a conductive filament used as a wire in a cross base material of a third embodiment.

A third embodiment of the present invention will be described hereinafter with reference to FIGS. 5A through 5D. The third embodiment is an applied example of the above-described first embodiment. As illustrated in FIG. 5A, a cross substrate 10c is formed by using, as the cross base material 30, surface-covered-type filaments 21 in which the surfaces of the conductive filaments 20 are covered by an insulative resin 26.

Figure 5B:
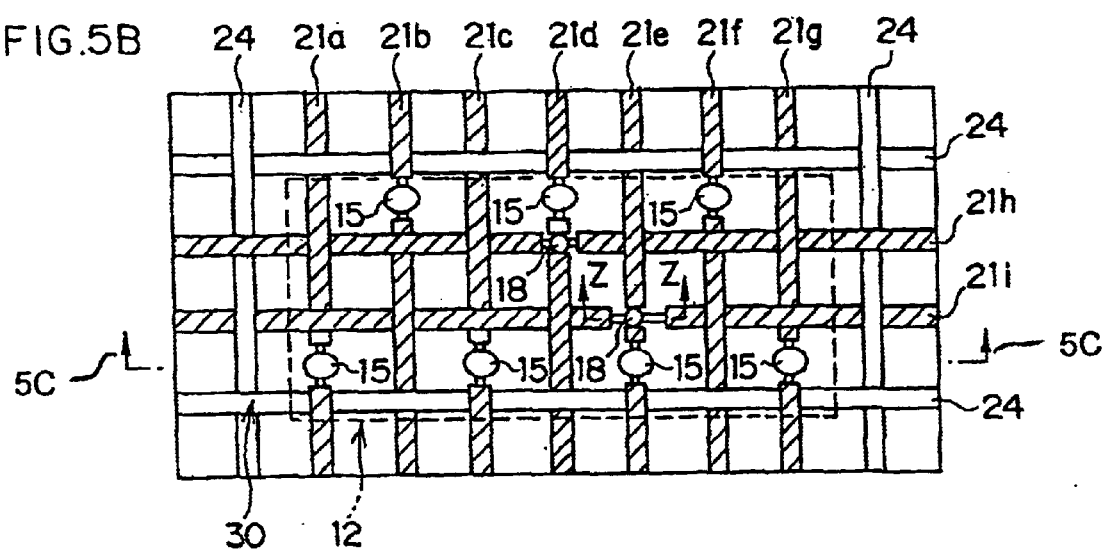
FIG. 5B is a partial top view illustrating an example of the cross base material of the third embodiment.
Figure 5C:
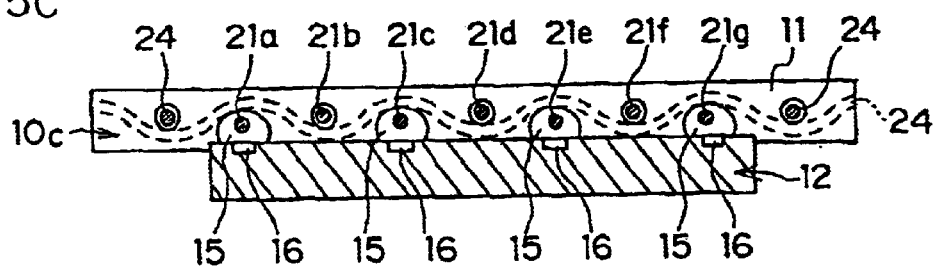
FIG. 5C is a sectional view taken along line Y—Y of FIG. 5B.

Because the surface of the surface-covered-type filament 21 is covered by an insulative resin 26, even if two surface-covered-type filaments 21 contact each other, there is no forming of short circuits. Accordingly, in the present third embodiment, as illustrated in FIG. 5B, surface-covered-type filaments 21 are used as both the warp threads and the weft threads of the cross substrate 30 so as to form wires extending in both the lengthwise direction and the widthwise direction.

Figure 5D:
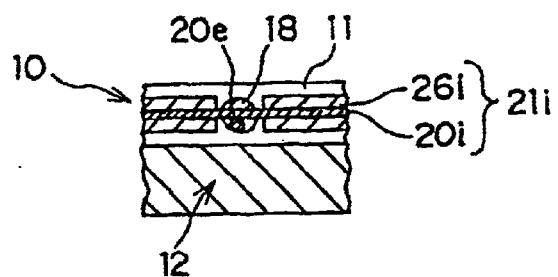
FIG. 5D is a sectional view taken along line Z—Z of FIG. 5B.

One of the surface-covered-type filaments 21a through 21g used as the warp threads (e.g., the fifth surface-covered-type filament 21e) and one of the surface-covered-type filaments 21 used as the weft threads (e.g., the ninth surface-covered-type filament 21i) are selected, and as illustrated in FIG. 5D, at the position of intersection thereof, the insulative resin 26 is removed from the surfaces of the surface-covered-type filaments 21e, 21i), and the exposed portions thereof are joined by a metal solder 18. By electrically connecting the conductive filaments 20e and 20i in this manner, one wire is formed, and this one wire is provided in two directions (the lengthwise direction and the widthwise direction).

In the present third embodiment, the surface-covered-type filaments 21 function as ground wires, signal wires, and power source wires, in that order from the first surface-covered-type filament 21a. Namely, the signal wires are disposed between the ground wires and the power source wires. Thus, at the time a switching operation is carried out, there is little variation in the electric potential due to respective signal wires affecting one another, and the switching operation is stable. Of course, the present invention is not limited to this structure in which the filaments are disposed in the order of ground wires, signal wires, and power source wires, and respective functions can be appropriately assigned to the respective filaments in accordance with the object. Further, because other structures are the same as those of the above-described first embodiment, description thereof is omitted.

In the present third embodiment, by using the surface-covered-type filaments as material for the wires, the filaments can be used as wires in both the direction of the warp threads and the direction of the weft threads. Namely, in addition to the effects of the above-described first embodiment, there is also the effect that, because the number of degrees of freedom in arranging the wires provided at the cross substrate 10c is greater than in structures using conductive filaments only for the warp threads, semiconductor elements can be mounted on the cross substrate at a high density. This structure is particularly effective for MCM (multi chip module) semiconductor devices in which a plurality of semiconductor elements are mounted.

Even if the cross substrate 30 is sealed in a state in which the surface of the cross substrate 30 is exposed, the surface-covered-type filaments are used as the wires, and thus, the formation of short circuits between wires whose surfaces are exposed can be prevented. Thus, an even more electrically stable cross substrate can be provided.

Fourth Embodiment

Figure 6:
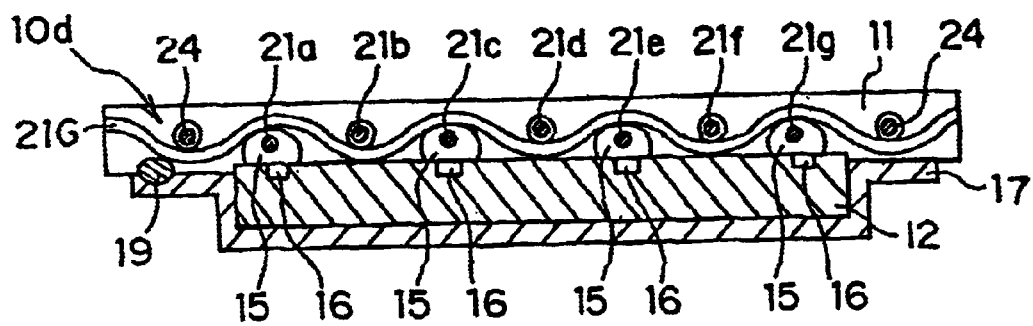
FIG. 6 is a sectional view schematically illustrating a cross substrate of a fourth embodiment of the present invention, to which a semiconductor element is mounted.

A fourth embodiment of the present invention will be described hereinafter with reference to FIG. 6. The semiconductor device of the present fourth embodiment is an applied example of the above-described third embodiment. As illustrated in FIG. 6, a potential terminal 19, which is connected to a ground wire 21G, is provided at the reverse surface side of a cross substrate 10d. Further, a conductive layer 17 is provided which has a thickness of several $\mu$m and which is connected to the potential terminal 19 and which covers the mounted semiconductor element 12 from the reverse surface side. The conductive layer 17 is formed from a conductive material such as a conductive paste or a conductive sheet, and controls the potential of the semiconductor element 12. The other structures are the same as those of the third embodiment, and therefore, description thereof will be omitted.

In the present fourth embodiment, because the conductive layer 17 which controls the potential of the semiconductor element 12 is provided, malfunctioning of the semiconductor element 12 can be prevented, and stable operation can be achieved. In other words, in addition to the effects of the above-described third embodiment, there is the additional effect that a semiconductor device having stable operation can be obtained.

Fifth Embodiment

Figure 7:
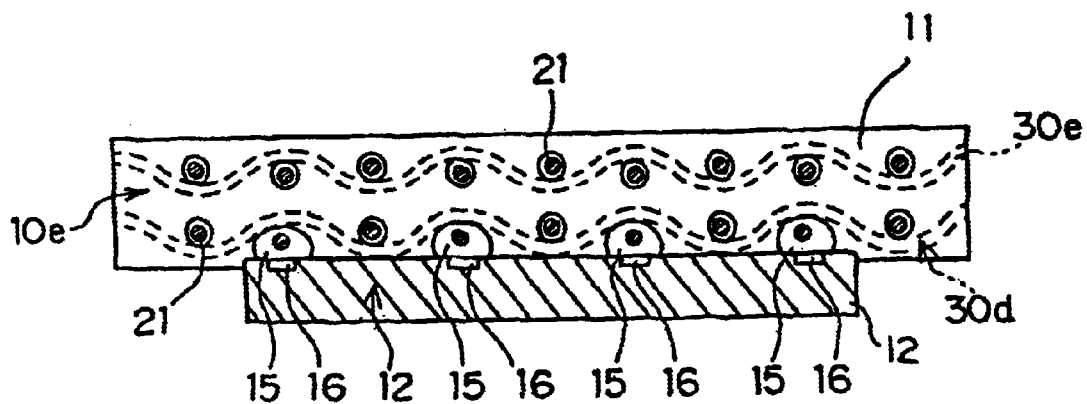
FIG. 7 is a sectional view schematically illustrating a cross substrate of a fifth embodiment of the present invention, to which a semiconductor element is mounted.

Hereinafter, a fifth embodiment of the present invention with will be described with reference to FIG. 7. The fifth embodiment is an applied example of the third embodiment. In the semiconductor device of the present fifth embodiment, as illustrated in FIG. 7, a cross substrate 10e is sealed by the sealing resin 11 such that a fourth and fifth cross base materials 30d and 30e (i.e., two layers) are contained in the interior of the cross substrate 10e.

The fourth cross base material 30d and the fifth cross base material 30e are each formed by using, as the warp threads and the weft threads thereof, the surface-covered-type filaments 21 in which the surfaces of the conductive filaments 20 are covered by the insulative resin 26. At the fourth cross base material 30d which is disposed at the semiconductor element 12 side within the cross substrate 10e, the wires of the warp and the wires of the weft are selected in accordance with the positions of the electrodes of the mounted semiconductor element 12, and the warp threads and the weft threads are connected at necessary positions. Further, the fifth cross base material 30e, which is provided above the fourth cross base material 30d, is not connected to the mounted semiconductor element. The fifth cross base material 30e serves as a shield for blocking electric waves and the like from the exterior.

Namely, in the present fifth embodiment, the cross substrate 10e is structured so as to include a cross member, which serves as a shield, above the cross member which is used as the wiring. Thus, noise caused by electric waves from the exterior can be blocked, and stable signal transmission can be carried out. Other structures are the same as those of the above-described third embodiment, and description thereof is therefore omitted.

Sixth Embodiment

Figure 8:
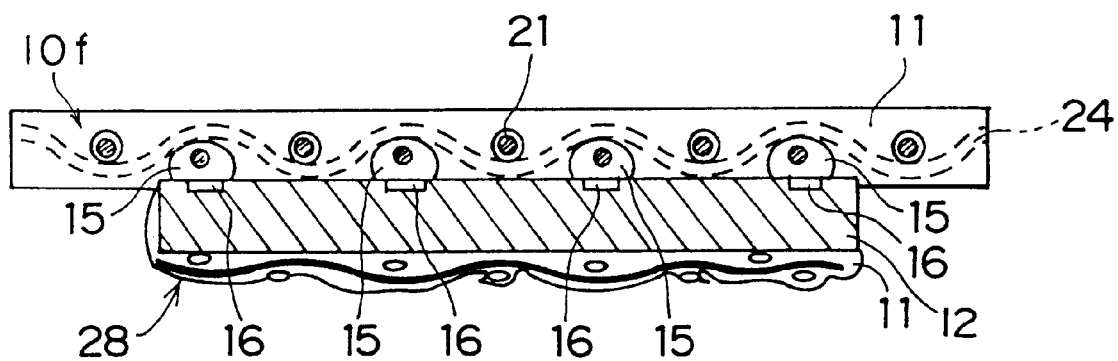
FIG. 8 is a sectional view schematically illustrating a cross substrate of a sixth embodiment of the present invention, to which a semiconductor element is mounted.

A sixth embodiment of the present invention will be described hereinafter with reference to FIG. 8. The present sixth embodiment is an applied example of the third embodiment. As illustrated in FIG. 8, a cross base material 28 for heat dissipation, which is a plain weave of filaments formed of a material having excellent heat conductivity such as copper, is sealed by resin at the reverse surface side of the semiconductor element 12 mounted to a cross substrate 10f. The cross base material 28 for heat dissipation is sealed together with the semiconductor element at the time of resin-sealing the cross base material for the wiring.

In the present sixth embodiment, the cross base material 28 for heat dissipation is provided at the reverse surface side of the semiconductor element 12. Therefore, the heat generated at the time of operation of the semiconductor element 12 is effectively released, and operational delays or malfunctioning of the semiconductor element 12 caused by heat can be prevented. Because other structures are the same as those of the third embodiment, description thereof will be omitted.

Seventh Embodiment

Figure 9A:
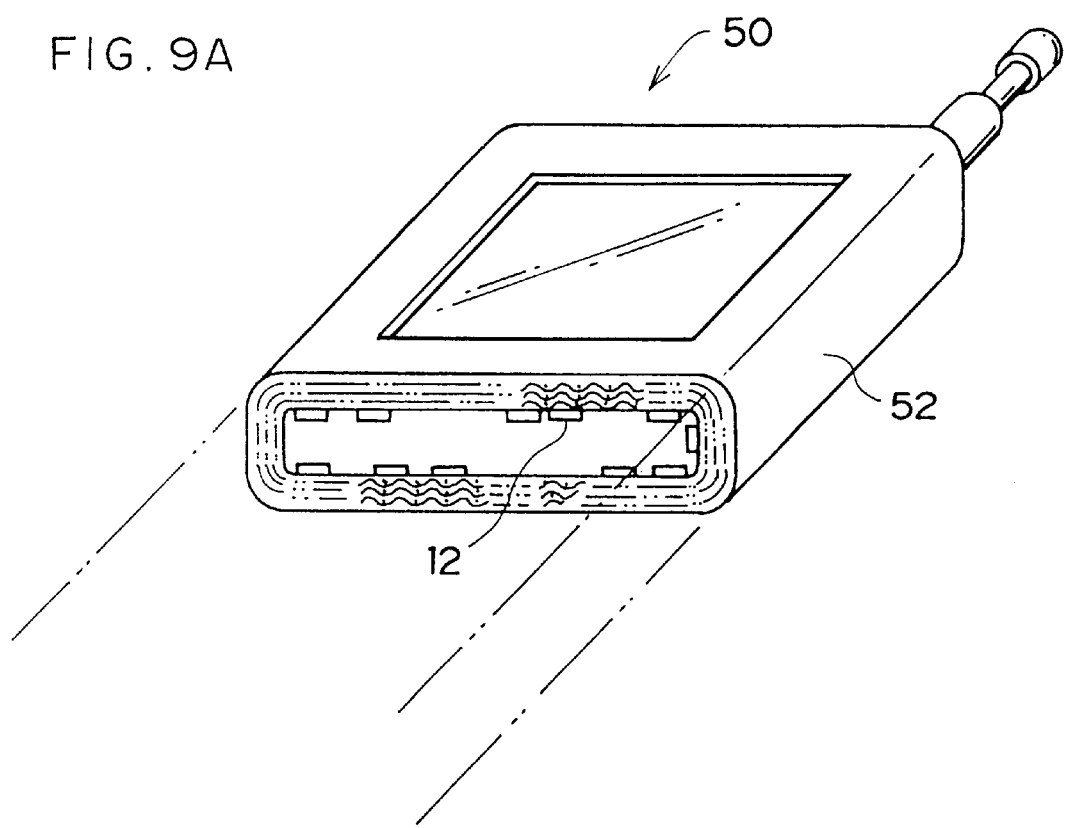
FIG. 9A is a diagram for schematically explaining a structural example of a cellular phone in which the cross substrate of the present invention is used as a mount substrate.
Figure 9B:
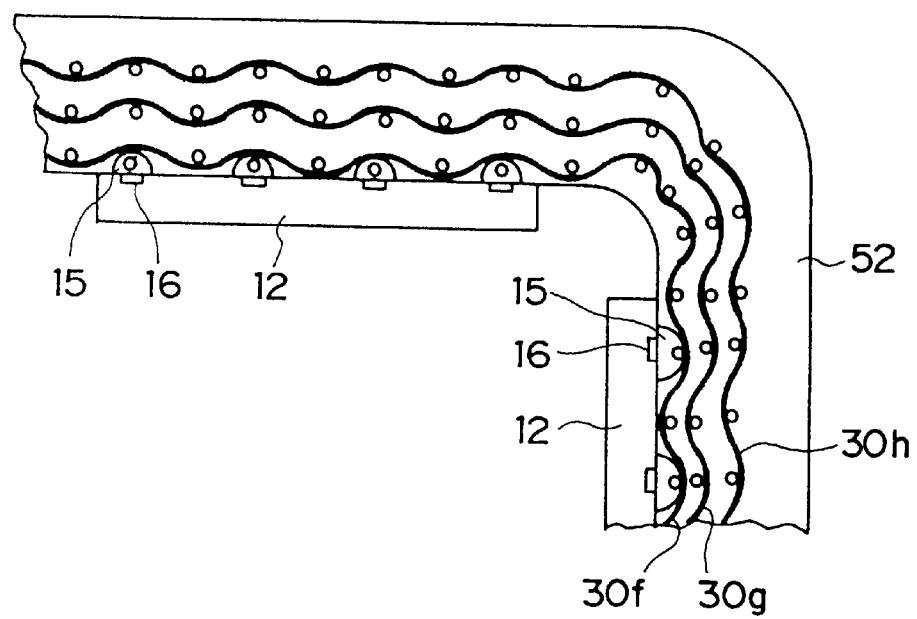
FIG. 9B is an enlarged partial sectional view of a corner portion of FIG. 9A.
Figure 10:
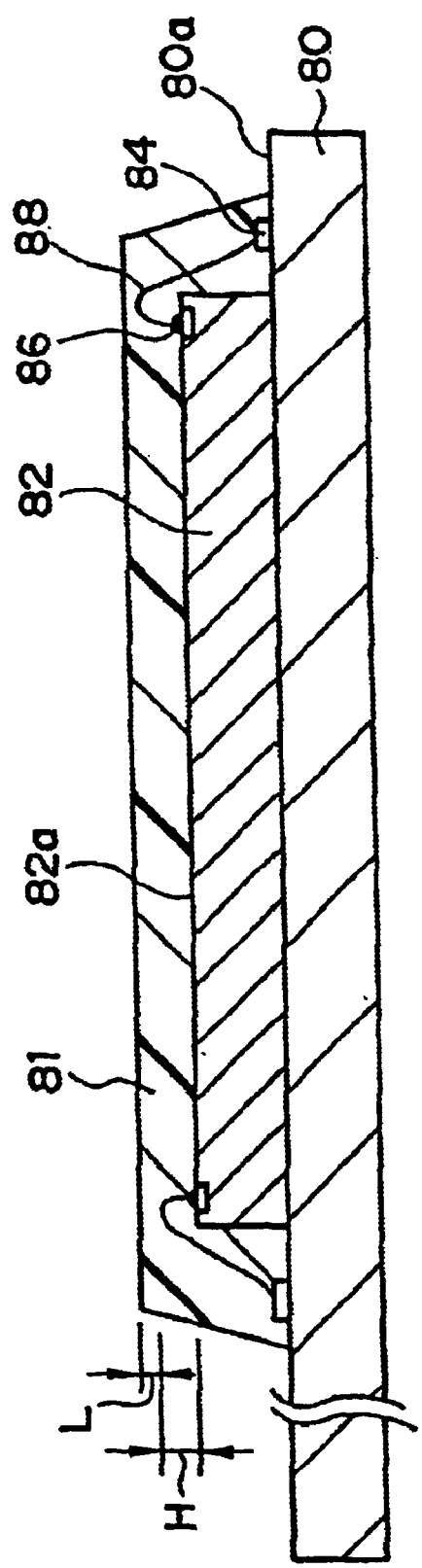
FIG. 10 is a sectional view for explaining a semiconductor device in which a semiconductor element is mounted to a conventional mount substrate by wire bonding.
Figure 11:
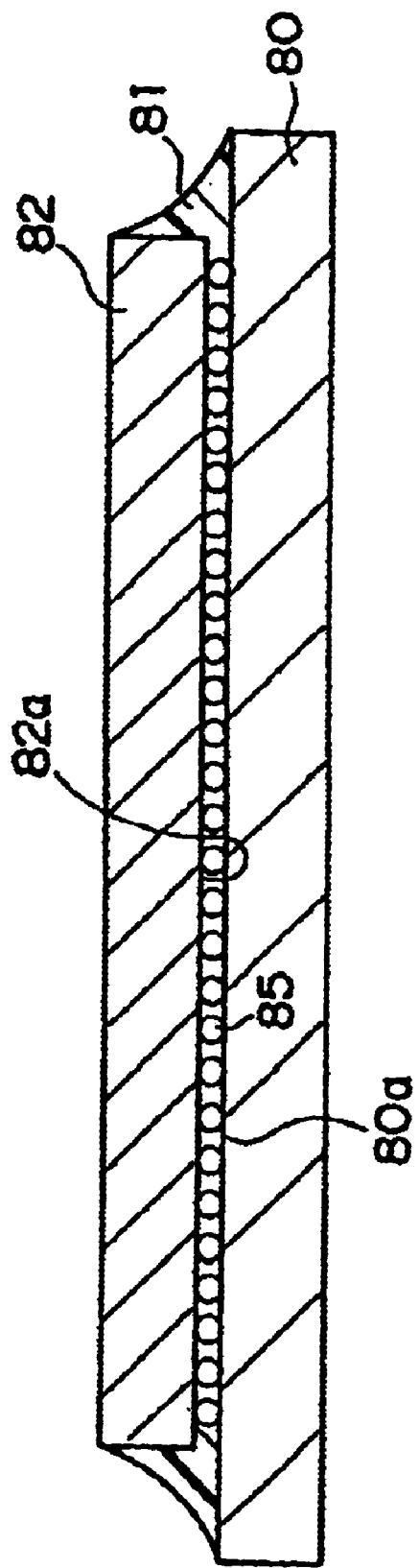
FIG. 11 is a sectional view for explaining a semiconductor device in which a semiconductor element is mounted to a conventional mount substrate by solder bumps.

A seventh embodiment of the present invention will be described hereinafter with reference to FIGS. 9A and 9B. The seventh embodiment is an applied example of the first through the sixth embodiments. FIGS. 9A and 9B illustrate a structural example of a case in which the cross substrate is used as the mount substrate at the casing of a cellular phone.

As illustrated in FIGS. 9A and 9B, a cross substrate 52 includes three layers of cross base materials 30f through 30h which are sealed by resin in the interior of the cross substrate 52. The cross base material 30f at the innermost side forms a wiring layer and is formed from the conductive filaments 20 which serve as wires. Although the intermediate cross base material 30g and the outermost side cross base material 30h are also formed from the conductive filaments 20, these cross base materials 30g and 30h do not function as wires. Rather, the cross base materials 30g and 30h protect the wiring layer cross base material 30f, the semiconductor elements, unillustrated internal members, and the like from shocks from the outside, and serve as shields which block electric waves from the exterior.

The semiconductor elements 12 are mounted to the inner surfaces of the casing. As illustrated in FIG. 9A, the semiconductor elements 12 can be mounted not just to one surface, but to plural surfaces. Thus, the mounting density is high, and there is no need for a mount substrate. Accordingly, a compact cellular phone can be realized.

In each of the above-described first through seventh embodiments, the cross substrate can be formed such that plural cross base materials are sealed in the interior of the cross substrate. In this case, there is no need to make the direction in which the upper layer cross base material filaments extend and the direction in which the lower layer cross base material filaments extend the same, and these directions can be different. In this way, there is even more freedom in arranging wires provided at the cross substrate. Thus, semiconductor elements can be mounted even more densely on the cross substrate. This structure is particularly effective in cases in which at least two cross base materials are used as wiring.

As described above, in accordance with the present invention, the thickness of a semiconductor device, which is obtained by mounting a semiconductor element, can be the same as or thinner than the total of the thickness of the semiconductor element and the thickness of the mount substrate. Further, because semiconductor elements can be mounted at a high mounting density, the obtained product can be made even more compact. Moreover, because the density at which circuits of the semiconductor element are formed is high and the semiconductor element itself can be made compact, the obtained product is also more compact.

What is claimed is:

1. A cross substrate comprising:
    at least one resin sealed layer of a cross member, said at least one resin sealed layer of a cross member having warp threads an weft threads, wherein a portion of at least one of the warp threads and the weft threads include a plurality of conductive thread-like wire members disposed substantially parallel to one another, with the thread-like wire members electrically insulated from one another; and
    a solder bump electrode disposed at one region of the thread-like wire members, said solder bump electrode being physically contacted to an electrode of an external semiconductor device for electrical connection to the external semiconductor device.

2. A cross substrate according to claim 1, wherein the thread-like wire members have surfaces covered by an insulating material, other than at the solder bump electrode.

3. A cross substrate according to claim 2, wherein a portion of both of the warp threads and the weft threads include a plurality of conductive thread-like wire members disposed substantially parallel to one another, with the thread-like wire members electrically insulated from one another, and at an intersecting position, at least one wire member of the warp threads crosses at least one wire member of the weft threads, and are electrically connected to one another at the intersecting position.

4. A cross substrate according to claim 1, further comprising at least one other layer of a cross member, said at least one other layer of a cross member having warp threads and weft threads, wherein a portion of at least one of the warp threads and the weft threads of said at least one other layer of a cross member include a plurality of conductive thread-like wire members disposed substantially parallel to one another, the thread-like wire members of said at least one other layer of a cross member being oriented in direction different from the thread-like wire members in the at least one resin sealed layer of a cross member.

5. A cross substrate according to claim 1, wherein said cross substrate forms a casing having an interior with an inner side surface, and a semiconductor element is provided at the inner side surface.

6. A cross substrate according to claim 1, wherein the solder bump electrode electrically contacts one of the plurality of conductive thread-like members.

7. A cross substrate comprising:
    a plurality of conductive members extending in a predetermined first direction;
    a plurality of insulating members extending in a second direction intersecting said first direction, and disposed so as to traverse regions between adjacent conductive members; and
    at least one solder bump electrode, disposed at one region of one of the plurality of conductive members, the at least one solder bump electrode being physically contacted to an electrode of an external semiconductor device for electrical connection to the external semiconductor device.

8. A cross substrate according to claim 7, wherein the plurality of conductive members, the plurality of insulating members and the at least one solder bump electrode are sealed in a resin, the at least one solder bump electrode having a surface electrically connected to the external semiconductor device.

9. A cross substrate according to claim 7, wherein the at least one solder bump electrode respectively electrically contacts the plurality of the conductive members.

* * * * *